(12) United States Patent
Guo

(10) Patent No.: US 11,418,884 B2
(45) Date of Patent: Aug. 16, 2022

(54) AUDIO PROCESSING APPARATUS, AUDIO CROSSTALK PROCESSING METHOD AND APPARATUS

(71) Applicant: ZTE CORPORATION, Guangdong (CN)

(72) Inventor: Shaochen Guo, Guangdong (CN)

(73) Assignee: ZTE Corporation, Guangdong (CN)

( * ) Notice: Subject to any disclaimer, the term of this patent is extended or adjusted under 35 U.S.C. 154(b) by 99 days.

(21) Appl. No.: 17/258,991

(22) PCT Filed: May 28, 2019

(86) PCT No.: PCT/CN2019/088873
§ 371 (c)(1),
(2) Date: Jan. 8, 2021

(87) PCT Pub. No.: WO2020/010943
PCT Pub. Date: Jan. 16, 2020

(65) Prior Publication Data
US 2021/0281949 A1 Sep. 9, 2021

(30) Foreign Application Priority Data
Jul. 12, 2018 (CN) .......................... 201810764476.0

(51) Int. Cl.
*H04R 3/14* (2006.01)
*H03F 3/181* (2006.01)
(Continued)

(52) U.S. Cl.
CPC ............... *H04R 3/14* (2013.01); *G06F 3/162* (2013.01); *H03F 3/181* (2013.01); *H03F 3/20* (2013.01);
(Continued)

(58) Field of Classification Search
CPC .. H04R 3/14; H04R 5/033; H04R 5/04; H04R 2420/09; H04R 3/12;
(Continued)

(56) References Cited

U.S. PATENT DOCUMENTS

2004/0257154 A1* 12/2004 Omata ...................... H03F 3/72
330/51
2013/0266146 A1  10/2013 Miao et al.
2015/0271595 A1   9/2015 Oh et al.

FOREIGN PATENT DOCUMENTS

CN        203167245 U    8/2013
CN        103297894 A    9/2013
(Continued)

OTHER PUBLICATIONS

International Search Report, PCT/CN2019/088873, dated May 28, 2019, 9 pgs.
(Continued)

*Primary Examiner* — Vivian C Chin
*Assistant Examiner* — Friedrich Fahnert
(74) *Attorney, Agent, or Firm* — USCH Law, PC

(57) ABSTRACT

Embodiments of the present disclosure provide an audio processing apparatus, and an audio crosstalk processing method and apparatus. The audio processing apparatus includes: an audio processing chip, a control switch and an audio output interface. The audio processing chip includes a first power amplifier and a second power amplifier; wherein the first power amplifier is configured to output a left channel signal; the second power amplifier is configured to output a right channel signal; and the control switch is coupled with a common negative terminal of the first power amplifier and the second power amplifier, and is configured to feed back a reference feedback signal to the common negative terminal, and connect a headphone ground signal of the audio output interface with a main board ground, the
(Continued)

reference feedback signal is obtained by performing voltage sampling on the headphone ground signal.

14 Claims, 6 Drawing Sheets

(51) Int. Cl.
*H03F 3/20* (2006.01)
*H04R 5/033* (2006.01)
*H04R 5/04* (2006.01)
*G06F 3/16* (2006.01)
*H04S 1/00* (2006.01)

(52) U.S. Cl.
CPC ............... *H04R 5/033* (2013.01); *H04R 5/04* (2013.01); *H04S 1/007* (2013.01); *H03F 2200/03* (2013.01); *H04R 2420/09* (2013.01)

(58) Field of Classification Search
CPC ..... H04R 2430/00; G06F 3/162; H03F 3/181; H03F 3/20; H03F 2200/03; H03F 1/34; H03F 2203/45138; H03F 3/68; H03F 3/45475; H03F 3/187; H04S 1/007

USPC ........................................................ 381/309
See application file for complete search history.

(56) References Cited

FOREIGN PATENT DOCUMENTS

| CN | 104519444 A | | 4/2015 |
|---|---|---|---|
| CN | 104581515 A | * | 4/2015 |
| CN | 104683903 A | | 6/2015 |
| CN | 204633989 U | | 9/2015 |
| CN | 105263076 A | | 1/2016 |
| CN | 105578353 A | | 5/2016 |
| WO | 2013152332 A1 | | 10/2013 |

OTHER PUBLICATIONS

ZTE Corporation, CN First Office Action, CN 201810764476.0, dated May 25, 2021, 8 pgs.

Yue Chen, "Xiaomi Mi 6's Best Companion Xiaomi Noise Cancelling Headphones Type C Edition," Computer&Network, Jul. 31, 2017, 3 pgs.

* cited by examiner

US 11,418,884 B2

AUDIO PROCESSING APPARATUS, AUDIO CROSSTALK PROCESSING METHOD AND APPARATUS

CROSS REFERENCE TO RELATED APPLICATIONS

The present application is a United States National Stage Application filed under 35 U.S.C. § 371 of PCT Patent Application Serial No. PCT/CN2019/088873, filed May 28, 2019, which claims the benefit of priority to Chinese Patent Application No. 201810764476.0, filed Jul. 12, 2018, each of which is incorporated by reference herein in its entirety.

TECHNICAL FIELD

The present disclosure relates to the field of communications, and particularly, to an audio processing apparatus, and an audio crosstalk processing method and apparatus.

BACKGROUND

In recent years, as people pursue high-quality music enjoyment, High-Fidelity (HiFi) has received increasing attention. High-fidelity of many HiFi professional playing devices and playback devices has reached a very high level. However, due to high prices, the HiFi professional devices have low penetration rate. With rapid popularization of smart phones, many brands of smart phones have already claimed to have HiFi decoding and playing abilities. An audio output interface of a smart phone mainly includes a 3.5 millimeter (mm) headphone jack and a Universal Serial Bus (USB) Type-C interface. Almost all input interfaces of audio playback devices are 3.5 mm headphone jacks; and this means that a USB Type-C to 3.5 mm headphone jack adapter is needed when transmitting music by using a USB Type-C interface on a mobile phone without a 3.5 mm headphone jack.

The current smart phones are getting thinner and thinner; many mobile phones have now replaced the 3.5 mm headphone jack with a USB type-C interface, and further use the USB type-C interface to multiplex an audio jack and a USB interface. However, many headphone playback devices still have a 3.5 mm jack, and an audio signal transmitted on the USB type-C interface is still an analog signal. This requires a dedicated interface converting circuit to be added. Consequently, as jointly affected by a USB signal-to-audio signal switching circuit and a type-C interface-to-3.5 mm jack adapting circuit, a HiFi index, especially, a crosstalk level, significantly deteriorates. Crosstalk refers to a level of separation between a left channel and a right channel of stereo audio. Such an index is mainly applicable to cases where users listen to HiFi music with headphones. If the index is too bad, positioning and sense of space of music will be seriously affected, which is unacceptable to professional users.

In addition, there are some smart phones still using a 3.5 mm headphone jack; in order to support compatibility between an American Open Mobile Terminal Platform (OMTP) standard headphone and a Cellular Telecommunications and Internet Association (CTIA) standard headphone, a self-adaptive switching circuit is integrated on an internal main board of a mobile phone; and such a switching circuit also reduces the crosstalk index.

SUMMARY

At least some embodiments of the present disclosure provide an audio processing apparatus, and an audio crosstalk processing method and apparatus, which at least address the problem of excessive crosstalk between channels that affects users' listening experience and that are easily caused by the audio processing apparatus in existing technologies.

According to an embodiment of the present disclosure, there is provided an audio processing apparatus, including: an audio processing chip, a control switch and an audio output interface; the audio processing chip including: a first power amplifier and a second power amplifier; wherein, the first power amplifier is configured to output a left channel signal; the second power amplifier is configured to output a right channel signal; and the control switch is coupled with a common negative terminal of the first power amplifier and the second power amplifier, and is configured to feed back a reference feedback signal to the common negative terminal, and connect a headphone ground signal of the audio output interface with a main board ground; the reference feedback signal is obtained by performing voltage sampling on the headphone ground signal.

According to another embodiment of the present disclosure, there is provided another audio processing apparatus, including: an audio processing chip and an audio output interface, the audio processing chip including a first power amplifier and a second power amplifier; wherein, the first power amplifier is configured to output a left channel signal; the second power amplifier is configured to output a right channel signal; and the audio output interface is coupled with a common negative terminal of the first power amplifier and the second power amplifier, and is configured to feed back a reference feedback signal to the common negative end, and connect a headphone ground signal of the audio output interface with a main board ground, the reference feedback signal is obtained by performing voltage sampling on the headphone ground signal.

According to another embodiment of the present disclosure, there is provided an audio crosstalk processing method, including: acquiring a type of a headphone device plugged in; controlling, according to the type of the headphone device, a common negative terminal of a first power amplifier and a second power amplifier of an audio processing chip to be connected with an audio output interface, feeding back a reference feedback signal to the common negative terminal, and connecting a headphone ground signal of the audio output interface with a main board ground; the reference feedback signal being obtained by performing voltage sampling on the headphone ground signal; and determining, by using a path resistor and a channel load resistor of the headphone device, channel crosstalk of the headphone device, wherein, the path resistor is a resistor between a preset position and an output terminal of a headphone device common ground, and the preset position is a position of a control switch that connects the common negative terminal with the audio output interface and connects the headphone ground signal with the main board ground.

According to another embodiment of the present disclosure, there is provided an audio crosstalk processing apparatus, including: an acquiring module, configured to acquire a type of a headphone device plugged in; a processing module, configured to control, according to the type of the headphone device, a common negative terminal of a first power amplifier and a second power amplifier of an audio processing chip to be connected with an audio output interface, feed back a reference feedback signal to the common negative terminal, and connect a headphone ground signal of the audio output interface with a main board ground, the reference feedback signal being obtained by performing voltage sampling on the headphone ground signal; and a determining module, configured to determine, by using a path resistor and a channel load resistor of the headphone device, channel crosstalk of the headphone device, wherein, the path resistor is a resistor between a preset position and an output terminal of a headphone device common ground, and the preset position is a position of a control switch that connects the common negative terminal with the audio output interface and connects the headphone ground signal with the main board ground.

According to another embodiment of the present disclosure, there is further provided a terminal device including an audio processing apparatus, and the audio processing apparatus includes: an audio processing chip, a control switch and an audio output interface. The audio processing chip includes a first power amplifier and a second power amplifier; wherein, the first power amplifier is configured to output a left channel signal; the second power amplifier is configured to output a right channel signal; and the control switch is coupled with a common negative terminal of the first power amplifier and the second power amplifier, and is configured to feed back a reference feedback signal to the common negative end, and connect a headphone ground signal of the audio output interface with a main board ground. The reference feedback signal is obtained by performing voltage sampling on the headphone ground signal.

According to another embodiment of the present disclosure, there is further provided a storage medium, the storage medium having a computer program stored thereon; wherein, the computer program is configured to execute steps in any one of the above-described method embodiments when run.

According to another embodiment of the present disclosure, there is further provided an electronic apparatus, including a memory and a processor, wherein, the memory has a computer program stored thereon; and the processor is configured to execute steps in any one of the above-described method embodiments when running the computer program.

In at least some embodiments of the present disclosure, the control switch enables the common negative terminal of the first power amplifier and the second power amplifier of the audio processing chip to connect with the audio output interface, for feeding back the reference feedback signal to the common negative terminal, and connects the headphone ground signal of the audio output interface with the main board ground, so the load resistor of the common ground terminal is replaced by the path resistor when determining crosstalk between the sound channels of the headphone device, so as to reduce an order of magnitude of resistance, and further reduce crosstalk between the channels, which, thus, can address the problem that the audio processing apparatus provided in the related technologies easily causes excessive crosstalk between channels and affects users' listening experience, to achieve an effect of improving the crosstalk index, so that the users can get a stronger sense of space and more accurately position musical instruments in music when listening to HiFi music with the headphones.

BRIEF DESCRIPTION OF THE DRAWINGS

The drawings illustrated herein are provided for further understanding the present disclosure and constitute a part of the present disclosure, and are used for explaining the present disclosure together with the exemplary embodiments of the present disclosure and description thereof, rather than improperly limiting the present disclosure.

DETAILED DESCRIPTION

Hereinafter, the present disclosure will be described in detail with reference to the accompanying drawings and in conjunction with the embodiments. It should be noted that, in case of no conflict, the embodiments of the present disclosure and the features in the embodiments may be combined with each other.

It should be noted that, in the specification and the claims as well as the above-described accompanying drawings of the present disclosure, words such as "first", "second" and the like are used to distinguish similar objects, and are not necessarily used to describe any specific order or precedence.

Figure 1:
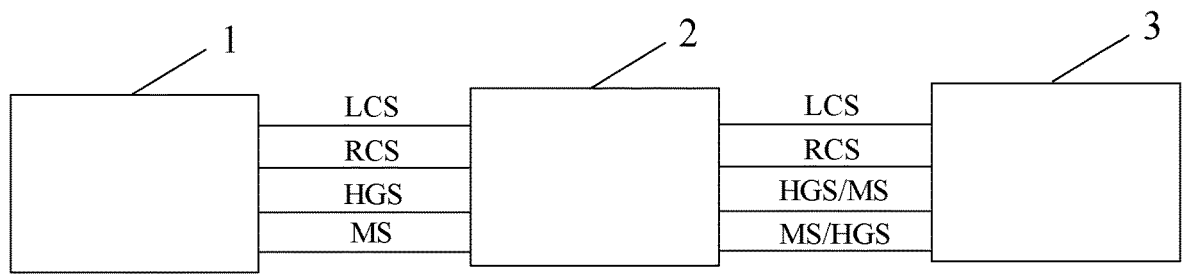
FIG. 1 is a schematic diagram of a typical circuit in a case where a headphone audio output interface is adopted according to related technologies.

FIG. 1 is a schematic diagram of a typical circuit in a case where a headphone audio output interface is used according to related technologies; and as shown in FIG. 1, an audio signal is output from an audio coding and decoding chip (CODEC) 1, and includes: a left channel signal (LCS), a right channel signal (RCS), a headphone ground signal (HGS) and a microphone signal (MIC Signal, MS). The audio signal is output by a switching circuit 2 to an audio jack 3; and the switching circuit 2 is substantially a circuit added in order to adapt to a European standard headphone and an American standard headphone, and has a main function of mutual exchanging the ground signal and the microphone signal.

In such design, a common ground wire of a left channel and a right channel is taken as a current return path, causing crosstalk to be large. Under normal circumstances, by performing logarithm operation on a ratio of a rated output voltage of the left channel to a voltage generated due to crosstalk in the right channel, a decibel obtained is just crosstalk.

Figure 2:
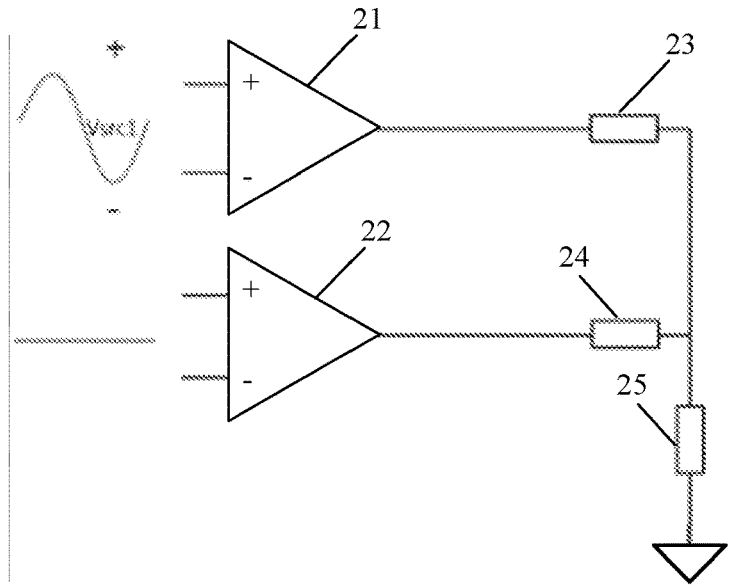
FIG. 2 is a schematic diagram of an alternating-current equivalent circuit adopted according to the related technologies.

FIG. 2 is a schematic diagram of an alternating-current equivalent circuit adopted according to the related technologies; and as shown in FIG. 2, it is assumed that a sine wave signal is input at a first power amplifier 21 and there is no input at a second power amplifier 22. A load resistor of the left channel is $R_{load1}$ 23, a load resistor of the right channel is $R_{load2}$ 24, and a resistor of a common ground terminal is $R_{gnd}$ 25. Voltage drop generated by the left channel signal on the common terminal resistor is $V_{gnd}$.

From the alternating-current equivalent circuit, a formula of crosstalk may be derived as:

$$\text{Crosstalk(dB)} = 20 \times \log\left(\frac{R_{gnd} \| R_{load2}}{R_{gnd} \| R_{load2} + R_{load1}}\right)$$

Where, $R_{gnd}$ is much smaller than $R_{load2}$ so it may be approximately considered that a numerator has only $R_{gnd}$. However, in a denominator, $R_{gnd} \| R_{load2}$ is much smaller than $R_{load1}$, so crosstalk caused by the left channel signal to the right channel may be simplified as a formula below:

$$\text{Crosstalk(dB)} = 20 \times \log\frac{R_{gnd}}{R_{load1}}$$

That is, a resistance of $R_{gnd}$ of the common current return path of the left channel and the right channel is a unique index that affects crosstalk. By reducing the resistance of $R_{gnd}$, the generated crosstalk may be reduced.

At present, in related technologies, the ground wire current return path from a CODEC side is long and has a large resistance, which, plus an ON-resistance of the switching circuit, makes $R_{gnd}$ large, usually above 1 Ohm; while the load resistance $R_{load1}$ is usually 32 Ohms, and thus, crosstalk in the above-described formula may be further determined as:

Crosstalk(dB)=20×log 1/32=−30.1(dB)

Under normal circumstances, a value of a HiFi-index, i.e., crosstalk, is required to be less than −65 dB by default in the industry. Apparently, the crosstalk value calculated by using the above-described formula is obviously higher than −65 dB, which easily causes poor subjective hearing feeling of a user.

An embodiment of the present disclosure provides an audio crosstalk processing method. The method embodiment provided by the embodiment of the present disclosure may be executed in a terminal device. The terminal device may be a device that supports audio play and requires a HiFi sound quality, such as a smart phone (e.g., an Android phone, an iOS phone, etc.), a tablet personal computer, a palmtop computer, a laptop, and a mobile Internet device (MID). A method running on a smart phone is taken as an example.

Figure 3:
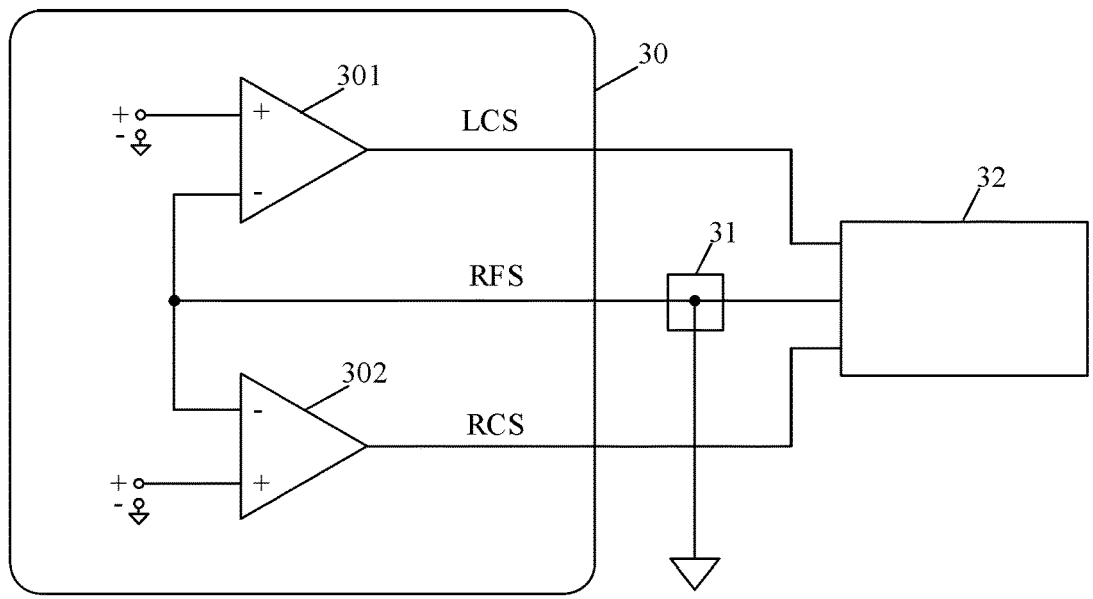
FIG. 3 is a structural schematic diagram of an audio processing apparatus in a mobile terminal according to an embodiment of the present disclosure.

FIG. 3 is a structural schematic diagram of an audio processing apparatus on a mobile terminal according to an embodiment of the present disclosure. As shown in FIG. 3, the audio processing apparatus includes: an audio processing chip 30, a control switch 31 and an audio output interface 32. The audio processing chip 30 includes a first power amplifier 301 and a second power amplifier 302. The first power amplifier 301 is configured to output a left channel signal; the second power amplifier 302 is configured to output a right channel signal. The control switch 31 is coupled with a common negative terminal of the first power amplifier and the second power amplifier, and is configured to feed back a reference feedback signal (RFS) to the common negative terminal, and connect a headphone ground signal of the audio output interface with a main board ground. The reference feedback signal is obtained by performing voltage sampling on the headphone ground signal.

The above-described audio processing chip may include but is not limited to: a CODEC chip represented by AIC23, cs8420, AK5385BVS, AK4396, CMI8738, SRC4382, etc. Hereinafter, alternative embodiments will be described by taking the CODEC chip as an example.

As shown in FIG. 3, while the CODEC chip outputs the left channel signal and the right channel signal, a common ground wire signal at a negative terminal of the left channel power amplifier and the right channel power amplifier is replaced with the reference feedback signal, and a current return path of the signal is changed from the previous ground signal to a ground signal of a printed circuit board (PCB). The reference feedback signal is coupled to the headphone ground signal of the audio output interface through the switching circuit for sampling, and meanwhile, the headphone ground signal of the audio output interface is connected with the main board ground through a low-resistance switch.

Figure 4:
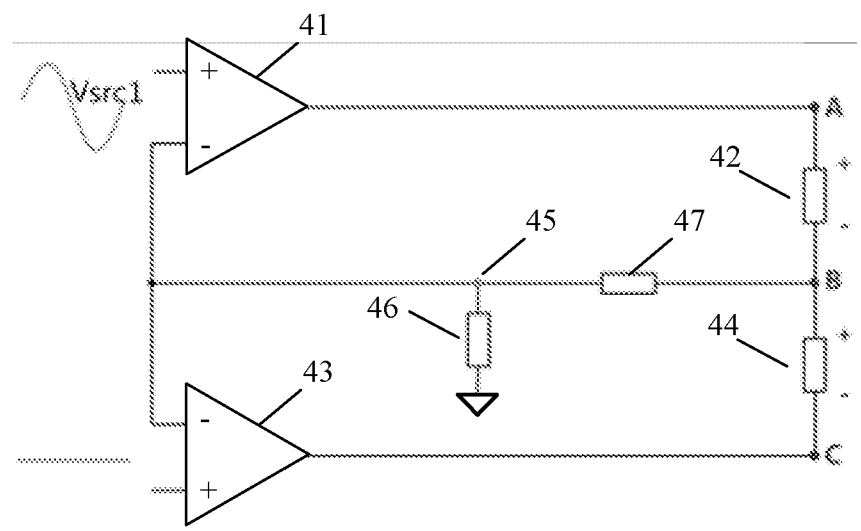
FIG. 4 is an equivalent circuit based on the circuit shown in FIG. 3 according to an alternative embodiment of the present disclosure.

FIG. 4 is an equivalent circuit based on the circuit shown in FIG. 3 according to an alternative embodiment of the present disclosure. As shown in FIG. 4, a load resistor of a left channel where a first power amplifier 41 is located is $R_{load1}$ 42, and a load resistor of a right channel where a second power amplifier 43 is located is $R_{load2}$ 44. The left channel has an input signal $V_{src1}$, and the right channel has no input signal. A resistor $R_{gnd}$ 46 from a newly added switch point 45 to the ground is a current return path of the left channel signal; voltage drop generated on $R_{gnd}$ 46 is $V_{gnd}$, and a resistor from the switch point 45 to point B is $R_{par}$ 47. From a perspective of the alternating-current equivalent circuit, a voltage at point A is $V_{src1}+V_{gnd}$, and a voltage at point B is $V_{gnd} V_{par}$, so a voltage between point A and point B is $U_{AB}=(V_{src1}+V_{gnd})-(V_{gnd}+V_{par})=V_{src1}-V_{par}$. Since the right channel has no input signal, point C and the switch point are equipotential, and each have a voltage $V_{gnd}$ to the ground, thus a voltage between point B and point C is $U_{BC}=(V_{gnd}+V_{par}) V_{gnd}=V_{par}$.

Thus, it can be seen that, according to a definition of crosstalk, crosstalk generated by the left channel signal on the right channel is:

$$\text{Crosstalk} = 20 \times \log\frac{U_{bc}}{U_{ab}} = 20 \times \log\frac{V_{par}}{V_{src1} - V_{par}} = 20 \times \log\frac{R_{par} \| R_{load2}}{R_{par} \| R_{load2} + R_{load1}}$$

A resistance of $R_{par}$ is a resistance between a switch access point and an output terminal of a headphone common ground set by the embodiment of the present disclosure, and a resistance value of the resistor depends on a specific headphone. Similarly, $R_{par}$ is much smaller than $R_{load2}$, $R_{par} \| R_{load2}$ is much smaller than $R_{load1}$, and thus, crosstalk generated by the left channel signal on the right channel may be simplified as:

$$\text{Crosstalk} = 20 \times \log \frac{R_{par}}{R_{load1}}$$

As compared with the technical solution provided by the related technologies, a determining factor of crosstalk is changed from $R_{gnd}$ to $R_{par}$. Under normal circumstances, $R_{gnd}$ across an integrated switch is usually greater than 1 Ohm. By the newly set switch path, $R_{par}$ is reduced by an order of magnitude as compared with $R_{gnd}$, and is less than 0.1 Ohms. The resistance of the headphone usually is still 32 Ohms. If calculated by taking $R_{par}$ equal to 0.1 Ohms, crosstalk has a calculation result below:

$$\text{Crosstalk} = 20 \times \log \frac{0.1}{32} = -50.1 \text{(dB)}$$

Thus, it can be seen that, as compared with −30.1 dB obtained in the related technologies, the technical solution of the embodiment of the present disclosure at least can reduce the result by 20 dB, and has a very obvious improving effect.

In an alternative embodiment, when the audio output interface is a headphone jack of a first preset type, the control switch includes: a first terminal, a second terminal, a third terminal, a fourth terminal, a fifth terminal, a first single-throw switch, a second single-throw switch and a third single-throw switch. The first terminal is configured to receive a control signal from the audio processing chip; the second terminal is configured to receive the reference feedback signal; the third terminal is configured to receive the microphone signal from the audio output interface. The fourth terminal is configured to perform first signal interaction with the audio output interface, and the first signal includes one of: the headphone ground signal and the microphone signal. The fifth terminal is configured to perform second signal interaction with the audio output interface, and the second signal includes one of: the headphone ground signal and the microphone signal. The first single-throw switch is configured to, under control of the control signal, connect the second terminal with the fourth terminal or the fifth terminal. The second single-throw switch is configured to, under control of the control signal, connect the third terminal with the fourth terminal or the fifth terminal. The third single-throw switch is configured to connect the headphone ground signal with the main board ground. The terminal connected by the first single-throw switch and the terminal connected by the second single-throw switch are mutually exclusive.

Taking the terminal device as a smart phone, the above-described audio output interface may be a 3.5 mm headphone jack (i.e., the above-described headphone jack of the first preset type).

Figure 5:
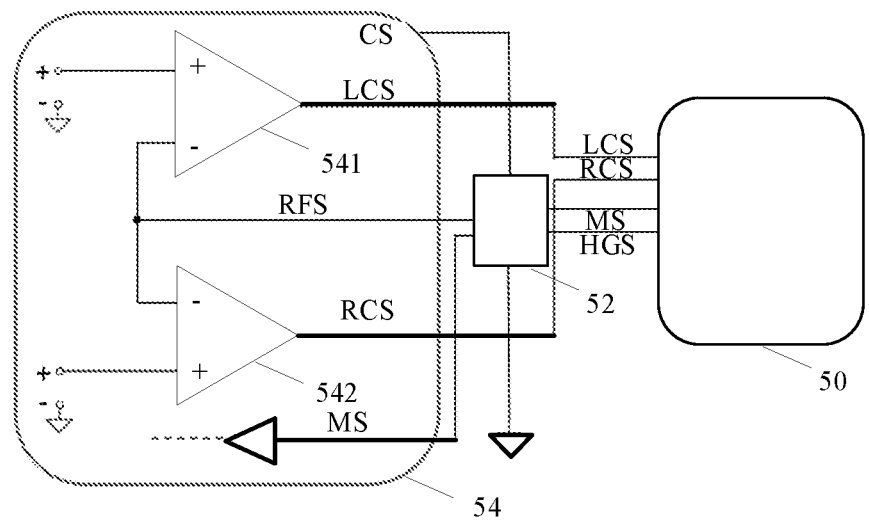
FIG. 5 is a schematic diagram of using a 3.5 mm headphone jack as an audio output interface in a smart phone according to an alternative embodiment of the present disclosure.
Figure 6:
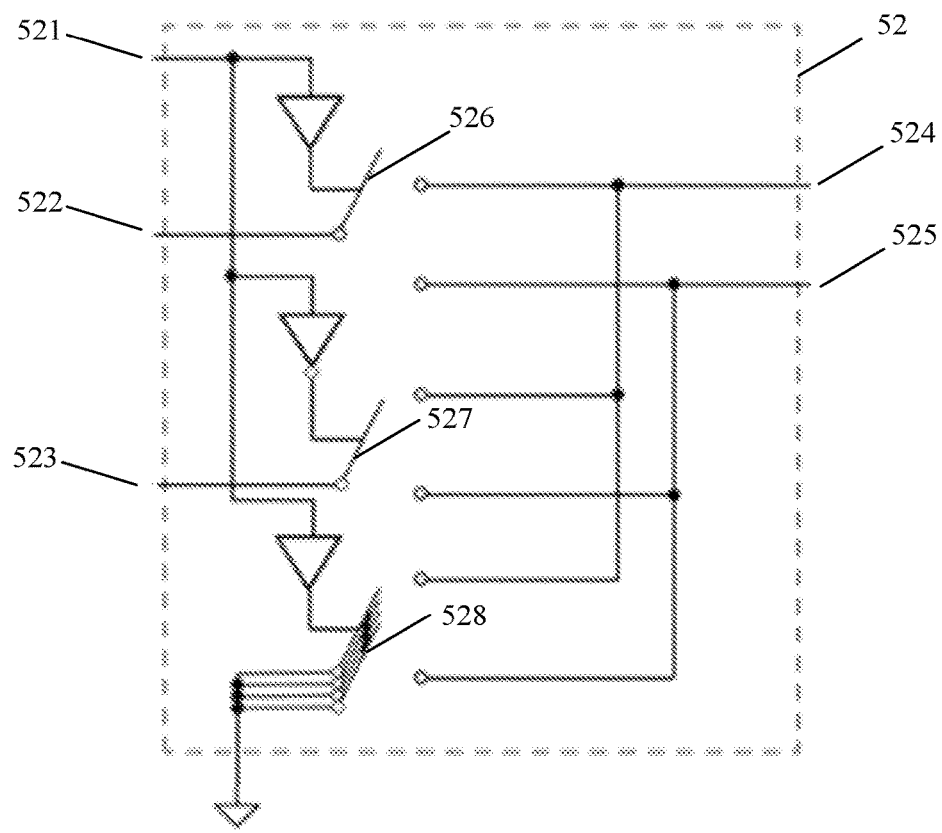
FIG. 6 is a schematic diagram showing a circuit structure of a control switch according to an alternative embodiment of the present disclosure.

FIG. 5 is a schematic diagram of using a 3.5 mm headphone jack as an audio output interface in a smart phone according to an alternative embodiment of the present disclosure. As shown in FIG. 5, a CODEC chip 54 includes a first power amplifier 541 and a second power amplifier 542. Since there is a difference between a 3.5 mm headphone jack 50 of an OMTP standard and a 3.5 mm headphone jack 50 of a CTIA standard, in order to make headphone jacks of the two different standards compatible with each other, a separate control switch 52 may be provided between the 3.5 mm headphone jack 50 and the CODEC chip 54. FIG. 6 is a schematic diagram showing a circuit structure of a control switch according to an alternative embodiment of the present disclosure. As shown in FIG. 6, the control switch 52 includes: a first terminal 521, a second terminal 522, a third terminal 523, a fourth terminal 524, a fifth terminal 525, a first single-throw switch 526, a second single-throw switch 527, and a third single-throw switch 528. The first terminal 521 is configured to receive a control signal (CS) shown in FIG. 5. The second terminal 522 is configured to receive a reference feedback signal (RFS) shown in FIG. 5. The third terminal 523 is configured to receive a microphone signal shown in FIG. 5. The fourth terminal 524 is configured to transmit the microphone signal shown in FIG. 5. The fifth terminal 525 is configured to transmit a headphone ground signal shown in FIG. 5.

After the headphone device plugged in has the type detected, it is switched to a mode corresponding to the type of the headphone device, so as to couple the reference feedback signal of the headphone to the headphone ground signal of the 3.5 mm headphone jack through the switch.

Specifically, the control signal is sent out from a CODEC chip side, and after headphone type detection is completed, the reference feedback signal and the microphone signal are set to respectively communicate with the headphone ground signal and the microphone signal. Switch logics to control the reference feedback signal and the microphone signal are mutually exclusive. Besides, it is also to set a current return path of the low-resistance headphone ground signal that is connected with the main board ground.

Considering that the smart terminals provided by the related technologies usually adopt an integrated switch to switch between an OMTP headphone and a CTIA headphone, when the common headphone ground signal is used as the current return path, according to the previously derived calculation formula:

$$\text{Crosstalk} = 20 \times \log \frac{R_{gnd}}{R_{load1}},$$

Since a resistance of $R_{gnd}$ is large, and voltage sampling is directly carried out on a far terminal of the headphone ground and fed back to a common terminal of the left channel amplifier and the right channel amplifier of the headphone, crosstalk generated by the left channel signal on the right channel is:

$$\text{Crosstalk} = 20 \times \log \frac{R_{par}}{R_{load1}},$$

From $R_{gnd}$ to $R_{par}$, a resistance value is reduced by more than 1 order of magnitude, and is about less than 0.1 Ohms. The resistance of the headphone usually is still 32 Ohms; and if calculated by taking $R_{par}$ equal to 0.1 Ohms, crosstalk has a calculation result below:

$$\text{Crosstalk} = 20 \times \log \frac{0.1}{32} = -50.1 \text{(dB)}$$

Thus, it can be seen that, as compared with −30.1 dB obtained in the related technologies, the embodiment of the present disclosure can reduce the result by 20 dB, and has a very obvious improving effect.

In an alternative embodiment, the first single-throw switch and the second single-throw switch are single-pole single-throw switches; and the third single-throw switch is a multi-pole single-throw switch.

In order to increase the current return path of the headphone, a return current signal is made to go through the ground wire. The third single-throw switch here may be a multi-pole single-throw switch, and is equivalent to a parallel connection of a plurality of single-pole single-throw switches, with a purpose to reduce the ON-resistance as much as possible.

In an alternative embodiment, when the audio output interface is a headphone jack of a second preset type, the control switch includes: a first terminal, a second terminal, a third terminal, a fourth terminal, a first single-throw switch, and a second single-throw switch. The first terminal is configured to receive the control signal from the audio processing chip; the second terminal is configured to receive the reference feedback signal. The third terminal is configured to perform first signal interaction with the audio output interface, and the first signal includes one of: the headphone ground signal and the microphone signal. The fourth terminal is configured to perform second signal interaction with the audio output interface, and the second signal includes one of: the headphone ground signal and the microphone signal. The first single-throw switch is configured to, under control of the control signal, connect the second terminal with the third terminal or the fourth terminal. The second single-throw switch is configured to connect a corresponding signal communicated by the first single-throw switch with the main board ground.

In an alternative embodiment, the first single-throw switch is a single-pole single-throw switch; and the second single-throw switch is a multi-pole single-throw switch.

Similarly, taking the mobile terminal as a smart phone, the above-described audio output interface may be a USB type-C interface (i.e., the above-described headphone jack of the second preset type).

Figure 7:
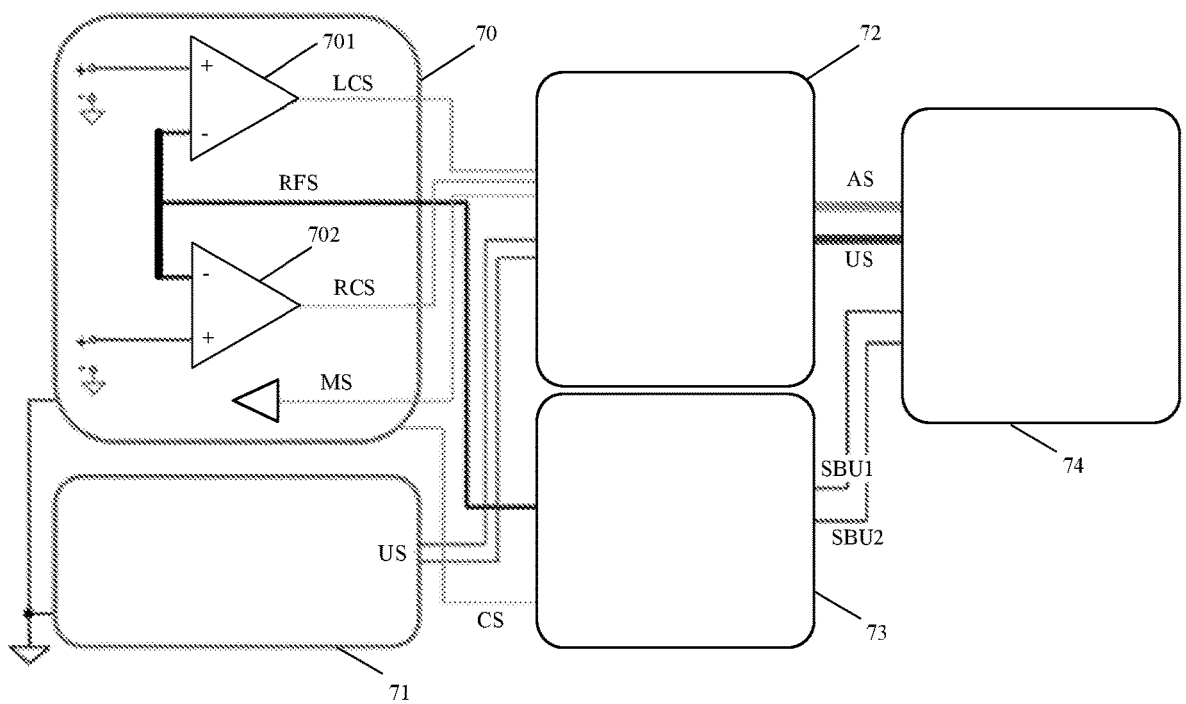
FIG. 7 is a schematic diagram of using a USB type-C interface as an audio output interface in a smart phone according to an alternative embodiment of the present disclosure.

FIG. 7 is a schematic diagram of using a USB type-C interface as an audio output interface in a smart phone according to an alternative embodiment of the present disclosure. As shown in FIG. 7, a CODEC chip 70 is an audio decoding chip, which includes: a first power amplifier 701 and a second power amplifier 702, and has a main function of: converting a digital audio signal into an analog audio signal, and amplifying, via an amplifier circuit, into an analog signal that can directly drive the headphone. Besides, the CODEC chip 70 also has functions of detecting headphone plug in/out and detecting a type of a plugged-in headphone.

A central processing unit (CPU) 71 is a processor of a smart phone, and in the alternative embodiment, is mainly manifested as an input/output interface of a USB signal (US).

A switching circuit 73 is a typical application circuit using a USB type-C interface as an audio output interface 74, and has a main function of: switching between an audio signal and a USB signal, and outputting the signal to the USB type-C interface according to the USB type-C standard. The audio signal (AS) includes a left channel signal, a right channel signal and a microphone signal, The USB signal includes D+ and D−. The switching circuit 73 is a component of the alternative embodiment, and a structure of the switching circuit 73 will be further described in detail below in conjunction with FIG. 8.

Figure 8:
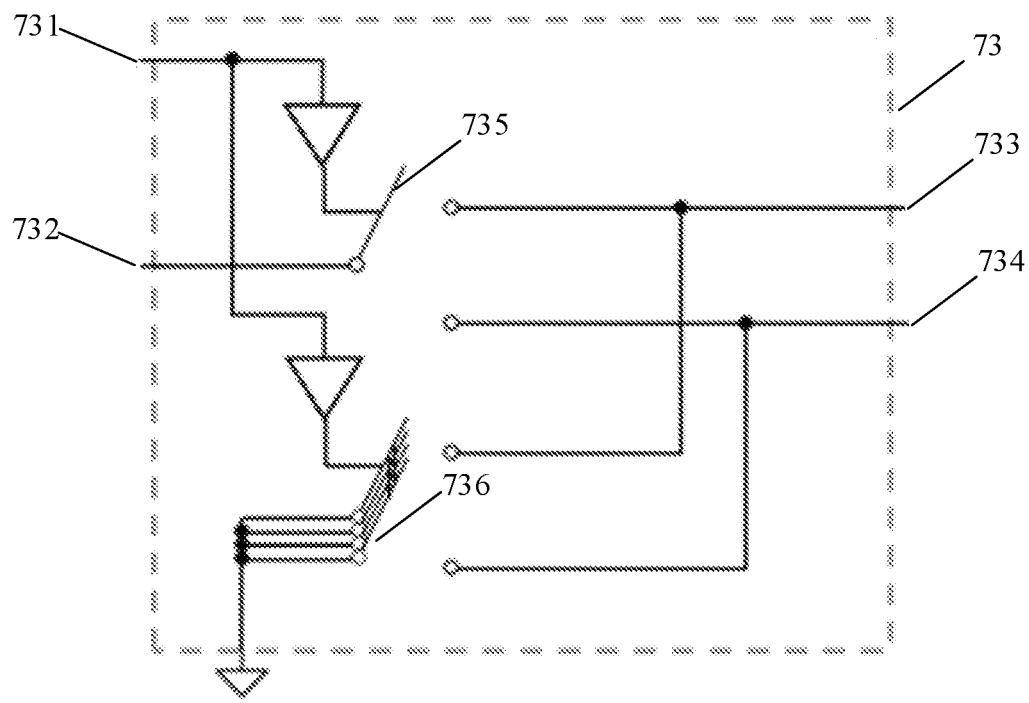
FIG. 8 is a schematic diagram of a switching circuit according to an alternative embodiment of the present disclosure.

FIG. 8 is a schematic diagram of a switching circuit according to an alternative embodiment of the present disclosure. As shown in FIG. 8, the switching circuit 73 includes: a first terminal 731, a second terminal 732, a third terminal 733, a fourth terminal 734, a first single-throw switch 735 and a second single-throw switch 736. The first terminal 731 is configured to receive a reference feedback signal (RFS) shown in FIG. 7. The second terminal 732 is configured to receive a control signal (CS) shown in FIG. 7. The third terminal 733 is configured to connect the reference feedback signal with a sensor board unit (SBU) 1 signal shown in FIG. 7. The fourth terminal 734 is configured to connect the reference feedback signal with a SBU2 signal shown in FIG. 7.

It can be seen that, main functions of the switching circuit 73 include at least one of the following.

Function 1: connect the reference feedback signal with the SBU1 or SBU2 signal, and feed back voltage fluctuation of the ground wire current return path to the amplifiers of the left channel and the right channel of the headphone.

Function 2: increase the current return path of the headphone so that a return current signal goes through the ground wire. The switch here is a multi-pole single-throw switch, which is equivalent to a parallel connection of a plurality of single-pole single-throw switches, with a purpose to reduce the ON-resistance as much as possible.

The SBU1 and the SBU2 respectively correspond to the ground wire or the microphone signal of the headphone. Since the USB type-C interface is both-side pluggable, after the CODEC chip detects a corresponding ground wire (GND) signal in the SBU1 and the SBU2, the input signal is connected with a corresponding output signal by the control signal. Moreover, the corresponding output signal is also connected with the ground wire to form the current return path.

Similarly, according to the previously derived calculation formula:

$$\text{Crosstalk} = 20 \times \log \frac{R_{gnd}}{R_{load1}},$$

However, by directly performing voltage sampling on the far terminal of the headphone ground and feeding back to the common terminal of the amplifiers of the left channel and the right channel of the headphone, a calculation formula for crosstalk becomes:

$$\text{Crosstalk} = 20 \times \log \frac{R_{par}}{R_{load1}},$$

From $R_{gnd}$ to $R_{par}$, a measured resistance value of $R_{par}$ is 0.018 Ohms, and the load resistance is still 32 Ohms, so crosstalk generated by the left channel signal on the right channel is:

$$\text{Crosstalk} = 20 \times \log \frac{R_{par}}{R_{load1}} = 20 \times \log \frac{0.018}{32} = -65(\text{dB}).$$

In an alternative embodiment, the control switch and the headphone jack of the second preset type are arranged on a printed circuit board.

Hereinafter, it is described by taking the printed circuit board as a flexible printed circuit board. Under normal circumstances, smart terminals all have a USB type-C interface arranged on a flexible printed circuit board at a bottom portion, and then connected with a main board through the flexible printed circuit board. If a position of the switch is arranged on a main board side, then $R_{par}$ will increase to more than 1 Ohm, crosstalk will increase to more than 20 dB; and therefore, the position of the switch needs to be as close as possible to the USB type-C socket, that is, the control switch and the USB type-C interface may be both arranged on the flexible printed circuit board.

An embodiment of the present disclosure further provides a terminal device; the terminal device includes the above-described audio processing apparatus. The audio processing apparatus includes: an audio processing chip, a control switch and an audio output interface; and the audio processing chip includes a first power amplifier and a second power amplifier. The first power amplifier is configured to output a left channel signal. The second power amplifier is configured to output a right channel signal. The control switch is coupled with a common negative terminal of the first power amplifier and the second power amplifier, and is configured to feed back a reference feedback signal to the common negative terminal, and connect a headphone ground signal of the audio output interface with a main board ground. The reference feedback signal is obtained by performing voltage sampling on the headphone ground signal.

Figure 9:
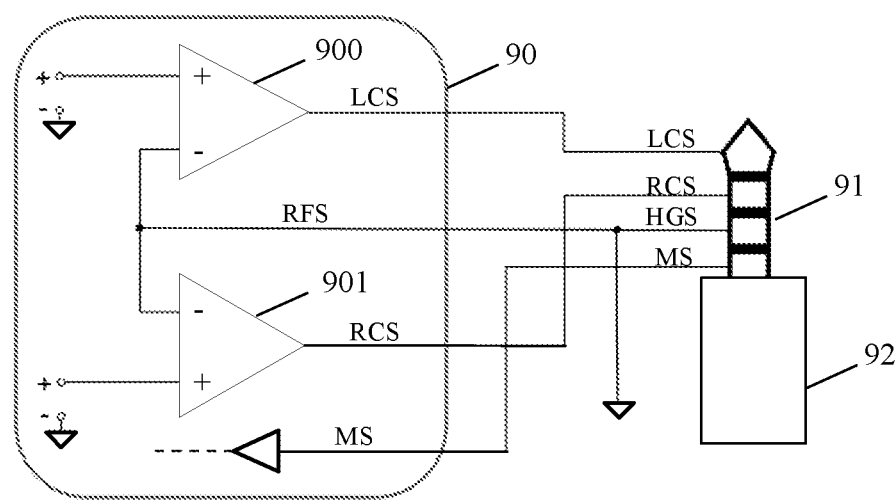
FIG. 9 is a structural schematic diagram of another audio processing apparatus in a mobile terminal according to an embodiment of the present disclosure.

FIG. 9 is a structural schematic diagram of another audio processing apparatus in a mobile terminal according to an embodiment of the present disclosure. As shown in FIG. 9, the audio processing apparatus includes: an audio processing chip 90 and an audio output interface 91. The audio processing chip 90 includes a first power amplifier 900 and a second power amplifier 901. The first power amplifier 900 is configured to output a left channel signal; the second power amplifier 901 is configured to output a right channel signal. The audio output interface 91 is coupled with a common negative terminal of the first power amplifier and the second power amplifier, and is configured to feed back a reference feedback signal to the common negative terminal, and connect a headphone ground signal of the audio output interface with a main board ground. The reference feedback signal is obtained by performing voltage sampling on the headphone ground signal.

In this embodiment, by taking the terminal device as a smart phone, the above-described audio output interface may be a 3.5 mm headphone jack. When the smart phone uses the 3.5 mm headphone jack as the audio output interface, a CTIA headphone is plugged in. According to a headphone type (OMTP or CTIA), the headphone type is limited to CTIA in terms of circuit, that is, a headphone plug wire sequence from top to bottom is for: a left channel signal, a right channel signal, a headphone ground signal and a microphone signal. Since the headphone type has been determined, there is no need to add a switch, but a common ground terminal in a CODEC chip is directly used for the reference feedback signal to be accessed to the headphone ground. Moreover, a current return path from the headphone ground to the PCB ground signal is provided at the access point.

When the common headphone ground signal is used as the current return path, according to the previously derived calculation formula:

$$\text{Crosstalk} = 20 \times \log \frac{R_{gnd}}{R_{load1}},$$

It can be found that, the resistance of $R_{gnd}$ is large. However, by directly performing voltage sampling on a far terminal of the headphone ground and feeding back to the common terminal of the amplifiers of the left channel and the right channel of the headphone, a calculation formula for crosstalk becomes:

$$\text{Crosstalk} = 20 \times \log \frac{R_{par}}{R_{load1}},$$

Without influence of a switch accessed, the measured resistance of $R_{par}$ is about 0.0057 Ohms, so that crosstalk generated by the left channel signal on the right channel is:

$$\text{Crosstalk} = 20 \times \log \frac{R_{par}}{R_{load1}} = 20 \times \log \frac{0.0057}{32} = -75(\text{dB}).$$

Thus, it can be seen that, as compared with −30.1 dB obtained in the related technologies, the technical solution of the embodiment of the present disclosure can reduce the result by about 35 dB, and has a very obvious improving effect.

An embodiment of the present disclosure further provides a terminal device, the terminal device includes the above-described audio processing apparatus; the audio processing apparatus includes: an audio processing chip and an audio output interface. The audio processing chip includes a first power amplifier and a second power amplifier. The first power amplifier is configured to output a left channel signal; the second power amplifier is configured to output a right channel signal. The audio output interface is coupled with a common negative terminal of the first power amplifier and the second power amplifier, and is configured to feed back a reference feedback signal to the common negative terminal, and connect a headphone ground signal of the audio output interface with a main board ground. The reference feedback signal is obtained by performing voltage sampling on the headphone ground signal.

Figure 10:
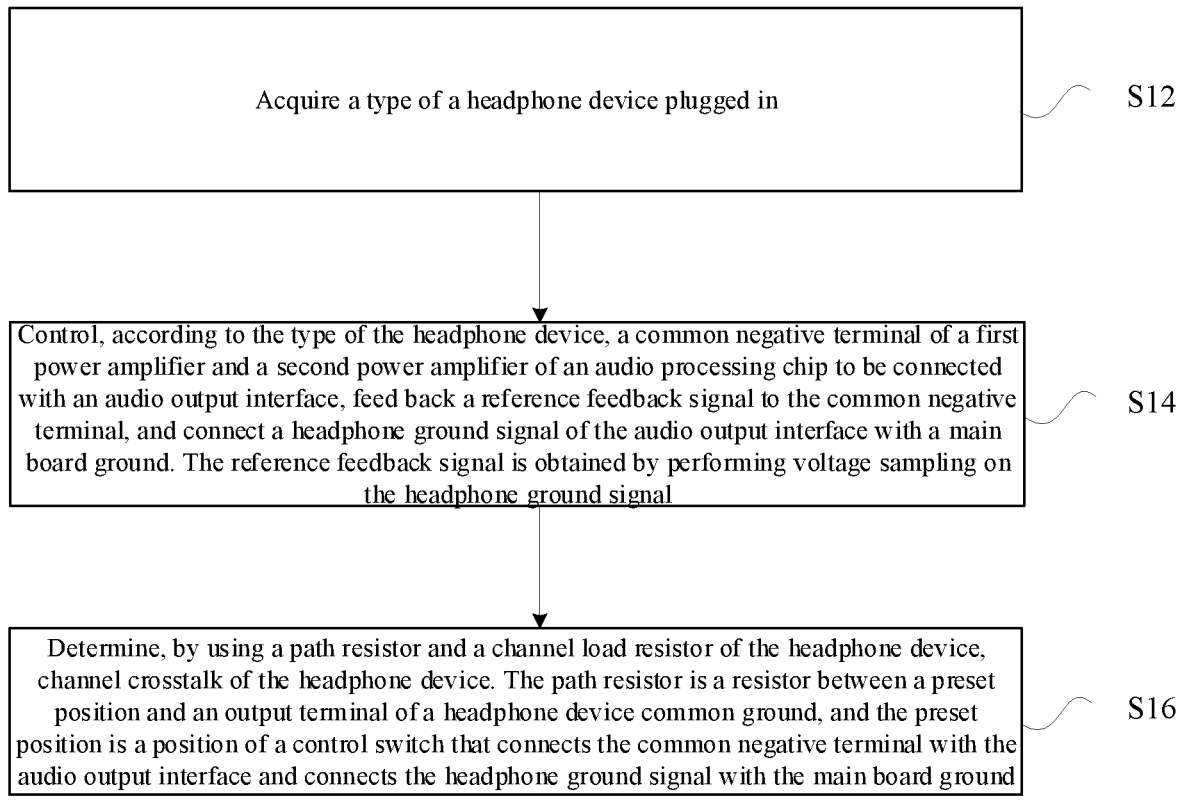
FIG. 10 is a flow chart of an audio crosstalk processing method according to an embodiment of the present disclosure.

Based on the foregoing audio processing apparatus, in this embodiment, there is provided an audio crosstalk processing method running on the above-described terminal device; FIG. 10 is a flow chart of the audio crosstalk processing method according to the embodiment of the present disclosure. As shown in FIG. 10, the process includes following steps.

Step S12: acquire a type of a headphone device plugged in.

Step S14: control, according to the type of the headphone device, a common negative terminal of a first power amplifier and a second power amplifier of an audio processing chip to be connected with an audio output interface, feed back a reference feedback signal to the common negative terminal, and connect a headphone ground signal of the audio output interface with a main board ground. The reference feedback signal is obtained by performing voltage sampling on the headphone ground signal.

Step S16: determine, by using a path resistor and a channel load resistor of the headphone device, channel crosstalk of the headphone device. The path resistor is a resistor between a preset position and an output terminal of a headphone device common ground, and the preset position is a position of a control switch that connects the common negative terminal with the audio output interface and connects the headphone ground signal with the main board ground.

The above-described steps address the problem that the audio processing apparatus provided in the related technologies easily causes excessive crosstalk between channels and affects users' listening experience, to achieve an effect of improving the crosstalk index, so that the users can get a stronger sense of space and more accurately position musical instruments in music when listening to HiFi music with the headphones.

Optionally, an executive subject of the above-described steps may be an audio processing chip in the mobile terminal, etc., but is not limited thereto.

In an alternative embodiment, step S14 of controlling, according to the type of headphone device, a common negative terminal to be connected with an audio output interface may include following execution steps.

Step S141: determine, according to the type of the headphone device, an interface to be connected in the audio output interface that corresponds to the headphone ground signal.

Step S142: control the common negative terminal to be connected with the interface to be connected.

The types of the above-described headphone device may include: an OMTP standard and a CTIA standard. An OMTP headphone has a pin arrangement for a left channel signal, a right channel signal, a microphone signal, and a headphone ground signal successively connected from top to bottom. A CTIA headphone has a pin arrangement for a left channel signal, a right channel signal, a headphone ground signal and a microphone signal successively connected from top to bottom. After it is detected that a headphone device is currently plugged in and a type of the headphone device currently plugged in is OMTP or CTIA, a manner of connecting the common negative terminal of the first power amplifier and the second power amplifier with the audio output interface may be controlled and performed according to the control signal, that is, the common negative terminal is connected with the headphone ground signal, to further perform voltage sampling on the far terminal of the headphone ground and feed back the same to the common negative terminal of the first power amplifier and the second power amplifier of the headphone.

In an alternative embodiment, step S16 of determining, by using a path resistor and a channel load resistor, channel crosstalk may include following steps.

Step S161: respectively acquire a first voltage and a second voltage when a sine wave signal is input at a first channel of the headphone device and no signal is input at a second channel of the headphone device, wherein, the first voltage is a voltage corresponding to a load resistor of the first channel, and the second voltage is a voltage corresponding to a load resistor of the second channel.

Step S162: equivalently take a ratio of the second voltage to the first voltage as a ratio of the path resistor to the load resistor of the first channel, perform logarithm operation on the ratio, and determine crosstalk generated by the first channel on the second channel.

Still taking the first channel as the left channel and the second channel as the right channel as shown in FIG. 4, the load resistor of the left channel is $R_{load1}$, and the load resistor of the right channel is $R_{load2}$. In this case, the left channel has an input signal $V_{src1}$, and the right channel has no input signal. A resistor $R_{gnd}$ 46 from a newly added switch point to the ground is a current return path of the left channel signal; voltage drop generated on $R_{gnd}$ is $V_{gnd}$. From a perspective of an alternating-current equivalent circuit, a voltage at point A is $V_{src1}+V_{gnd}$, and a voltage at point B is $V_{gnd}+V_{par}$, so a voltage between point A and point B (i.e., the above-described first voltage) is $U_{ab}=(V_{src1}+V_{gnd})-(V_{gnd}+V_{par})=V_{src1}-V_{par}$. Since the right channel has no input signal, point C and the switch point are equipotential, and each have a voltage $V_{gnd}$ to the ground, a voltage between point B and point C (i.e., the above-described second voltage) is $U_{bc}=(V_{gnd}+V_{par})-V_{gnd}=V_{par}$.

Thus, it can be seen that, according to a definition of crosstalk, crosstalk generated by the left channel signal on the right channel is:

$$\text{Crosstalk} = 20 \times \log\frac{U_{bc}}{U_{ab}} = 20 \times \log\frac{V_{par}}{V_{src1}-V_{par}} = 20 \times \log\frac{R_{par}\|R_{load2}}{R_{par}\|R_{load2}+R_{load1}}$$

A resistance of $R_{par}$ (i.e., the above-described path resistor) is a resistance between a switch access point and an output terminal of a headphone common ground set by the present disclosure, and a resistance value of the resistor depends on a specific headphone. Similarly, $R_{par}$ is much smaller than $R_{load2}$, $R_{par}\|R_{load2}$ is much smaller than $R_{load1}$, and thus, crosstalk generated by the left channel signal on the right channel may be simplified as:

$$\text{Crosstalk} = 20 \times \log\frac{R_{par}}{R_{load1}}$$

As compared with the technical solution provided by the related technologies, a determining factor of crosstalk is changed from $R_{gnd}$ to $R_{par}$. Under normal circumstances, $R_{gnd}$ across an integrated switch is usually greater than 1 Ohm. Across the newly set switch path, $R_{par}$ is reduced by an order of magnitude as compared with $R_{gnd}$, and is less than 0.1 Ohms. The resistance of the headphone usually is still 32 Ohms. If calculated by taking $R_{par}$ equal to 0.1 Ohms, crosstalk has a calculation result below:

$$\text{Crosstalk} = 20 \times \log\frac{0.1}{32} = -50.1(\text{dB})$$

Thus, it can be seen that, as compared with −30.1 dB obtained in the related technologies, the embodiment of the present disclosure at least can reduce the result by 20 dB, and has a very obvious improving effect.

Through the description of the above embodiments, those skilled in the art can clearly understand that the method according to the above-described embodiment may be implemented by software plus a necessary universal hardware platform, of course, it may also be implemented by hardware, but in many cases the former is a better implementation mode. Based on such understanding, the technical solutions of the present disclosure may essentially or a part thereof that contributes to the existing technology may be embodied in a form of a software product, the computer software product may be stored in a storage medium (e.g., ROM/RAM, a diskette, an optical disc), including instructions for causing a terminal device (which may be a mobile phone, a computer, a server, or a network device, etc.) to execute the methods as described in the respective embodiments of the present disclosure.

Based on the above-described audio crosstalk processing method, an embodiment of the present disclosure further provides an audio crosstalk processing apparatus, the apparatus is configured to implement the above-described embodiments and preferred embodiments, and no details will be repeated for what has been described. As used below, the term "module" may implement a combination of software and/or hardware with predetermined functions. Although the apparatus described in the following embodiment is preferably implemented by software, yet hardware or a combination of software and hardware is also possible and conceived.

Figure 11:
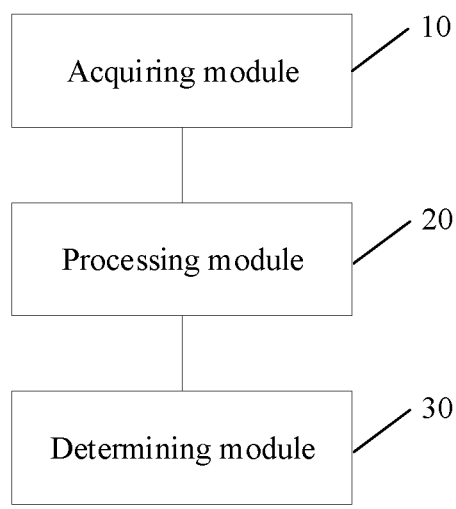
FIG. 11 is a structural block diagram of an audio crosstalk processing apparatus according to an embodiment of the present disclosure.

FIG. 11 is a structural block diagram of an audio crosstalk processing apparatus according to an embodiment of the present disclosure. As shown in FIG. 11, the apparatus includes an acquiring module 10, a processing module 20 and a determining module 30. The acquiring module 10 is configured to acquire a type of a headphone device plugged in. The processing module 20 is configured to control, according to the type of the headphone device, a common negative terminal of a first power amplifier and a second power amplifier of an audio processing chip to be connected with an audio output interface, feed back a reference feedback signal to the common negative terminal, and connect a headphone ground signal of the audio output interface with a main board ground, the reference feedback signal being obtained by performing voltage sampling on the headphone ground signal. The determining module 30 is configured to determine, by using a path resistor and a channel load resistor of the headphone device, channel crosstalk of the headphone device. The path resistor is a resistor between a preset position and an output terminal of a headphone device common ground, and the preset position is a position of a control switch that connects the common negative terminal with the audio output interface and connects the headphone ground signal with the main board ground.

Figure 12:
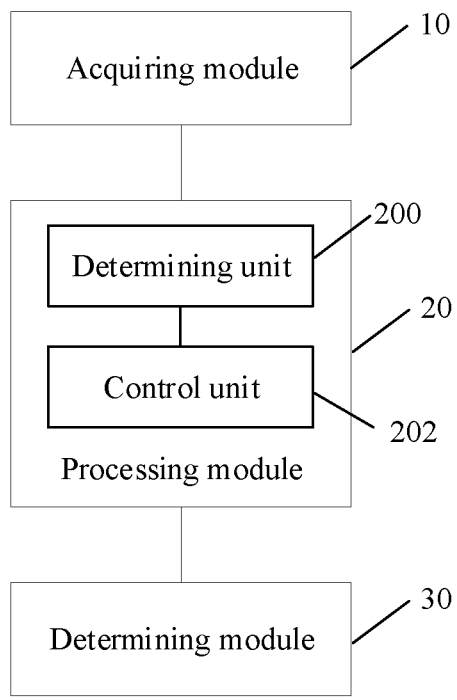
FIG. 12 is a structural block diagram of an audio crosstalk processing apparatus according to an alternative embodiment of the present disclosure.

In an alternative embodiment, FIG. 12 is a structural block diagram of an audio crosstalk processing apparatus according to an alternative embodiment of the present disclosure. As shown in FIG. 12, the processing module 20 includes a determining unit 200 and a control unit 202. The determining unit 200 is configured to determine, according to the type of the headphone device, an interface to be connected in the audio output interface that corresponds to the headphone ground signal. The control unit 202 is configured to control the common negative terminal to be connected with the interface to be connected.

Figure 13:
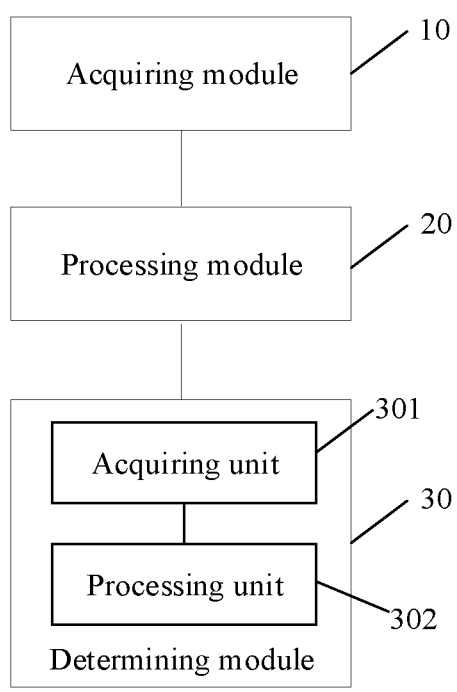
FIG. 13 is a structural block diagram of an audio crosstalk processing apparatus according to an alternative embodiment of the present disclosure.

In an alternative embodiment, FIG. 13 is a structural block diagram of an audio crosstalk processing apparatus according to an alternative embodiment of the present disclosure. As shown in FIG. 13, the determining module 30 includes an acquiring unit 300 and processing unit 302. The acquiring unit 300 is configured to respectively acquire a first voltage and a second voltage when a sine wave signal is input at a first channel of the headphone device and no signal is input at a second channel of the headphone device. The first voltage is a voltage corresponding to a load resistor of the first channel, and the second voltage is a voltage corresponding to a load resistor of the second channel. The processing unit 302 is configured to equivalently take a ratio of the second voltage to the first voltage as a ratio of the path resistor to the load resistor of the first channel, perform logarithm operation on the ratio, and determine crosstalk generated by the first channel on the second channel.

It should be noted that, the above-described respective modules may be implemented by software or hardware; with respect to the latter, it may be implemented in a manner below, but not limited thereto: the above-described modules are all located in a same processor; or, the above-described respective modules are, in any combination, respectively located in different processors.

Based on the above-described audio crosstalk processing method, an embodiment of the present disclosure further provides a storage medium, the storage medium having a computer program stored thereon; wherein, the computer program is configured to execute steps in any one of the above-described method embodiments when runs.

Optionally, in this embodiment, the above-described storage medium may be configured to store a computer program for executing following steps.

S1: acquire a type of a headphone device plugged in.

S2: control, according to the type of the headphone device, a common negative terminal of a first power amplifier and a second power amplifier of an audio processing chip to be connected with an audio output interface, feed back a reference feedback signal to the common negative terminal, and connect a headphone ground signal of the audio output interface with a main board ground, the reference feedback signal being obtained by performing voltage sampling on the headphone ground signal.

S3: determine, by using a path resistor and a channel load resistor of the headphone device, channel crosstalk of the headphone device. The path resistor is a resistor between a preset position and an output terminal of a headphone device common ground, and the preset position is a position of a control switch that connects the common negative terminal with the audio output interface and connects the headphone ground signal with the main board ground.

Optionally, the storage medium is further configured to store a computer program for executing following steps.

S1: determine, according to the type of the headphone device, an interface to be connected in the audio output interface that corresponds to the headphone ground signal.

S2: control the common negative terminal to be connected with the interface to be connected.

Optionally, the storage medium is further configured to store a computer program for executing following steps.

S1: respectively acquire a first voltage and a second voltage when a sine wave signal is input at a first channel of the headphone device and no signal is input at a second channel of the headphone device, wherein, the first voltage is a voltage corresponding to a load resistor of the first channel, and the second voltage is a voltage corresponding to a load resistor of the second channel.

S2: equivalently take a ratio of the second voltage to the first voltage as a ratio of the path resistor to the load resistor of the first channel, perform logarithm operation on the ratio, and determine crosstalk generated by the first channel on the second channel.

Optionally, in this embodiment, the above-described storage medium may include, but is not limited to: various media that can store computer programs such as a U disk, a Read-Only Memory (ROM), a Random Access Memory (RAM), a mobile hard disk, a diskette or an optical disc.

Based on the above-described audio crosstalk processing method, an embodiment of the present disclosure further provides an electronic apparatus, including a memory and a processor (i.e., the above-described audio processing chip), wherein, the memory has a computer program stored thereon; and the processor is configured to execute steps in any one of the above-described method embodiments when running the computer program.

Optionally, the above-described electronic apparatus may further include a transmission device and an input/output device, wherein, the transmission device is connected with the above-described processor, and the input/output device is connected with the above-described processor.

Optionally, in this embodiment, the above-described processor may be configured to, through a computer program, execute following steps.

S1: acquire a type of a headphone device currently plugged in;

S2: control, according to the type of the headphone device, a common negative terminal of a first power amplifier and a second power amplifier of an audio processing chip to be connected with an audio output interface, feed back a reference feedback signal to the common negative terminal, and connect a headphone ground signal of the audio output interface with a main board ground; the reference feedback signal is obtained by performing voltage sampling on the headphone ground signal.

S3: determine, by using a path resistor and a channel load resistor of the headphone device, channel crosstalk of the headphone device; the path resistor is a resistor between a preset position and an output terminal of a headphone device common ground, and the preset position is a position of a control switch that connects the common negative terminal with the audio output interface and connects the headphone ground signal with the main board ground.

Optionally, in this embodiment, the above-described processor may be further configured to, through a computer program, execute following steps.

S1: determine, according to the type of the headphone device, an interface to be connected in the audio output interface that corresponds to the headphone ground signal.

S2: control the common negative terminal to be connected with the interface to be connected.

Optionally, in this embodiment, the above-described processor may be further configured to, through a computer program, execute following steps.

S1: respectively acquire a first voltage and a second voltage when a sine wave signal is input at a first channel of the headphone device and no signal is input at a second channel of the headphone device. The first voltage is a voltage corresponding to a load resistor of the first channel, and the second voltage is a voltage corresponding to a load resistor of the second channel.

S2: equivalently take a ratio of the second voltage to the first voltage as a ratio of the path resistor to the load resistor of the first channel, perform logarithm operation on the ratio, and determine crosstalk generated by the first channel on the second channel.

Optionally, for specific examples in this embodiment, examples described in the above-described embodiments and alternative embodiments may be referred to, and no details will be repeated here in this embodiment.

Obviously, those skilled in the art should understand that, respective modules or respective steps according to the embodiments of the present disclosure as described above may be implemented by a general-purpose computing apparatus, which can be centralized on a single computing apparatus, or distributed on a network formed by a plurality of computing apparatuses; alternatively, they can be implemented with computing apparatus executable program codes, so that they can be stored in a storage apparatus to be executed by a computing apparatus, and in some cases, the steps shown or described may be executed in an order different from the order here, or they can be implemented by respectively fabricating them into respective integrated circuit modules, or fabricating a plurality of modules or steps among them into a single integrated circuit module. Thus, the embodiments of the present disclosure are not limited to any specific combination of hardware and software.

The methods disclosed in the several method embodiments provided by the embodiments of the present disclosure may be combined arbitrarily without conflict to obtain new method embodiments.

The features disclosed in the several product embodiments provided by the embodiments of the present disclosure may be combined arbitrarily without conflict to obtain new product embodiments.

The features disclosed in the several method or device embodiments provided by the embodiments of the present disclosure may be combined arbitrarily without conflict to obtain a new method embodiment or device embodiment.

The above are only alternative embodiments of the present disclosure, and not intended to limit the present disclosure. For those skilled in the art, various changes and modifications may be made to the embodiments of the present disclosure. Any modifications, equivalent alternations and improvements without departing from the spirit and principle of the embodiments of the present disclosure shall be included within the protection scope thereof.

What is claimed is:

1. An audio processing apparatus, comprising: an audio processing chip, a control switch and an audio output interface; wherein,
   the audio processing chip comprises a first power amplifier configured to output a left channel signal and a second power amplifier configured to output a right channel signal;
   the control switch is coupled with a common negative terminal of the first power amplifier and the second power amplifier, and is configured to feed back a reference feedback signal to the common negative terminal, and connect a headphone ground signal of the audio output interface with a main board ground; wherein, the reference feedback signal is obtained by performing voltage sampling on the headphone ground signal.

2. The apparatus according to claim 1, wherein, the audio output interface is a headphone jack of a first preset type, and the control switch comprises: a first terminal, a second terminal, a third terminal, a fourth terminal, a fifth terminal, a first switch, a second switch and a third switch; wherein,
   the first terminal is configured to receive a control signal from the audio processing chip;
   the second terminal is configured to receive the reference feedback signal;
   the third terminal is configured to receive a microphone signal from the audio output interface;
   the fourth terminal is configured to perform first signal interaction with the audio output interface, the first signal comprising one of the headphone ground signal and the microphone signal;
   the fifth terminal is configured to perform second signal interaction with the audio output interface, the second signal comprising one of the headphone ground signal and the microphone signal;
   the first switch is configured to, under control of the control signal, connect the second terminal with the fourth terminal or the fifth terminal;

the second switch is configured to, under control of the control signal, connect the third terminal with the fourth terminal or the fifth terminal;

the third switch is configured to connect the headphone ground signal with the main board ground; and a terminal connected by the first switch and a terminal connected by the second switch are mutually exclusive.

3. The apparatus according to claim 2, wherein, the headphone jack of a first preset type is a 3.5 mm headphone jack.

4. The apparatus according to claim 2, wherein, the first switch and the second switch are single-pole single-throw switches; and the third switch is a multi-pole single-throw switch.

5. The apparatus according to claim 1, wherein, the audio output interface is a headphone jack of a second preset type, and the control switch comprises: a first terminal, a second terminal, a third terminal, a fourth terminal, a first switch and a second switch; wherein, the first terminal is configured to receive a control signal from the audio processing chip;

the second terminal is configured to receive the reference feedback signal;

the third terminal is configured to perform first signal interaction with the audio output interface, the first signal comprising one of a headphone ground signal and a microphone signal;

the fourth terminal is configured to perform second signal interaction with the audio output interface, the second signal comprising one of the headphone ground signal and the microphone signal;

the first switch is configured to, under control of the control signal, connect the second terminal with the third terminal or the fourth terminal; and the second switch is configured to connect a corresponding signal through the first switch with the main board ground.

6. The apparatus according to claim 5, wherein, the headphone jack of a second preset type is a USB type-C interface.

7. The apparatus according to claim 5, wherein, the first switch is a single-pole single-throw switch; and the second switch is a multi-pole single-throw switch.

8. The apparatus according to claim 5, wherein, the control switch and the headphone jack of the second preset type are arranged on a printed circuit board.

9. An audio processing apparatus, comprising: an audio processing chip and an audio output interface, wherein, the audio processing chip comprises a first power amplifier configured to output a left channel signal and a second power amplifier configured to output a right channel signal;

the audio output interface is coupled with a common negative terminal of the first power amplifier and the second power amplifier, and is configured to feed back a reference feedback signal to the common negative terminal, and connect a headphone ground signal of the audio output interface with a main board ground; wherein the reference feedback signal is obtained by performing voltage sampling on the headphone ground signal.

10. The apparatus according to claim 9, wherein, the audio output interface is a 3.5 mm headphone jack.

11. An audio crosstalk processing method, comprising:

acquiring a type of a headphone device plugged in;

controlling, according to the type of the headphone device, a common negative terminal of a first power amplifier and a second power amplifier of an audio processing chip to be connected with an audio output interface, feeding back a reference feedback signal to the common negative terminal, and connecting a headphone ground signal of the audio output interface with a main board ground; wherein the reference feedback signal is obtained by performing voltage sampling on the headphone ground signal; and determining, by using a path resistor and a channel load resistor of the headphone device, channel crosstalk of the headphone device; wherein, the path resistor is a resistor between a preset position and an output terminal of a headphone device common ground, and the preset position is a position of a control switch that connects the common negative terminal with the audio output interface and connects the headphone ground signal with the main board ground.

12. The method according to claim 11, wherein, the controlling, according to the type of the headphone device, a common negative terminal to be connected with an audio output interface comprises:

determining, according to the type of the headphone device, an interface to be connected in the audio output interface that corresponds to the headphone ground signal; and controlling the common negative terminal to be connected with the interface to be connected.

13. The method according to claim 11, wherein, the determining, by using a path resistor and a channel load resistor, channel crosstalk comprises:

respectively acquiring a first voltage and a second voltage when a sine wave signal is input at a first channel of the headphone device and no signal is input at a second channel of the headphone device; wherein, the first voltage is a voltage corresponding to a load resistor of the first channel, and the second voltage is a voltage corresponding to a load resistor of the second channel; and equivalently taking a ratio of the second voltage to the first voltage as a ratio of the path resistor to the load resistor of the first channel, performing logarithm operation on the ratio, and determining crosstalk generated by the first channel on the second channel.

14. The method according to claim 11, wherein, the method is applied at an audio processing chip in a mobile terminal.

* * * * *